United States Patent
Milkov et al.

(10) Patent No.: US 10,560,646 B2
(45) Date of Patent: Feb. 11, 2020

(54) GLOBAL-SHUTTER VERTICALLY INTEGRATED PIXEL WITH HIGH DYNAMIC RANGE

(71) Applicant: Teledyne Scientific & Imaging, LLC, Thousand Oaks, CA (US)

(72) Inventors: Mihail Milkov, Moorpark, CA (US); Vincent Douence, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 103 days.

(21) Appl. No.: 15/957,729

(22) Filed: Apr. 19, 2018

(65) Prior Publication Data
US 2019/0327432 A1 Oct. 24, 2019

(51) Int. Cl.
*H04N 5/355* (2011.01)
*H04N 5/363* (2011.01)
*H04N 5/378* (2011.01)
*H01L 27/146* (2006.01)

(52) U.S. Cl.
CPC ......... *H04N 5/35554* (2013.01); *H04N 5/363* (2013.01); *H04N 5/378* (2013.01); *H01L 27/1464* (2013.01)

(58) Field of Classification Search
CPC ................................................ H04N 5/35554
See application file for complete search history.

(56) References Cited

U.S. PATENT DOCUMENTS

| | | |
|---|---|---|
| 5,880,495 A | 3/1999 | Chen |
| 5,904,493 A | 5/1999 | Lee et al. |
| 6,566,697 B1 | 5/2003 | Fox et al. |
| 6,667,768 B1 | 12/2003 | Fossum |
| 6,927,432 B2 | 8/2005 | Holm et al. |
| 7,271,835 B2 | 9/2007 | Iizuka et al. |
| 7,443,437 B2 | 10/2008 | Altice, Jr. et al. |

(Continued)

OTHER PUBLICATIONS

Chou, W. et al. "A 143dB 1.96% FPN Linear-Logarithmic CMOS Image Sensor With Threshold-Voltage Cancellation and Tunable Linear Range", IEEE (2012).
(Continued)

*Primary Examiner* — Cynthia Segura
(74) *Attorney, Agent, or Firm* — M.J. Ram and Associates

(57) ABSTRACT

A pixel comprising a pinned photodiode (PPD) which generates a photocurrent $I_{ph}$, a transfer gate connected in series between the PPD and a first node, a low-gain select transistor connected between the first node and a second node, a reset transistor connected between the second node and a reset voltage, a capacitance connected between the second node and a first constant potential, and a source-follower transistor whose source, gate and drain are connected to an output node, the first node and a second constant potential, respectively. When properly arranged, a vertically integrated (3D) global-shutter pinned PPD pixel is provided, which uses an overflow integration capacitor and subthreshold conduction of the reset transistor for increased dynamic range. Global shutter operation is achieved by storing the pixel output on sampling capacitors in another semiconductor layer at the end of integration.

34 Claims, 7 Drawing Sheets

(56) References Cited

U.S. PATENT DOCUMENTS

| | | | |
|---|---|---|---|
| 8,471,315 B1 | 6/2013 | Hynecek et al. | |
| 8,792,034 B2* | 7/2014 | Takahashi | H01L 27/14632 348/305 |
| 9,706,142 B2 | 7/2017 | Hynecek | |
| 9,843,738 B2* | 12/2017 | Cremers | H04N 5/2355 |
| 10,084,983 B2* | 9/2018 | Fahim | H04N 5/378 |
| 10,250,832 B1* | 4/2019 | Xu | H04N 5/363 |
| 10,264,199 B2* | 4/2019 | Takayanagi | H01L 27/14643 |
| 2006/0266922 A1 | 11/2006 | McGrath et al. | |
| 2008/0210986 A1 | 9/2008 | Mauritson | |
| 2009/0218606 A1 | 9/2009 | McCaffrey et al. | |
| 2009/0256060 A1 | 10/2009 | Meynants et al. | |
| 2012/0273854 A1 | 11/2012 | Velichko et al. | |
| 2013/0027597 A1 | 1/2013 | McCarten et al. | |
| 2014/0226047 A1 | 8/2014 | Lahav et al. | |
| 2016/0112665 A1* | 4/2016 | Meynants | H01L 27/14609 250/208.1 |
| 2017/0366764 A1* | 12/2017 | Innocent | H04N 5/353 |
| 2018/0103216 A1* | 4/2018 | Sakakibara | H04N 5/359 |
| 2018/0352181 A1* | 12/2018 | Nishikawa | H04N 5/363 |
| 2019/0124285 A1* | 4/2019 | Otaka | H04N 5/3559 |
| 2019/0198555 A1* | 6/2019 | Ahn | H01L 27/14634 |
| 2019/0260949 A1* | 8/2019 | Geurts | H01L 27/14609 |

OTHER PUBLICATIONS

Akahane, N. et al. "A Sensitivity and Linearity Improvement of a 100 dB Dynamic Range CMOS Image Sensor Using a Lateral Overflow Integration Capacitor", Symposium on VLSI Circuits Digest of Technical Papers (2005).

Kondo, O. et al. "A 3D Stacked CMOS Image Sensor With 16Mpixel Global-Shutter Mode Using 4 Million Interconnections" [Chemnitzer Seminar Jun. 23, 2015] Olympus.

* cited by examiner

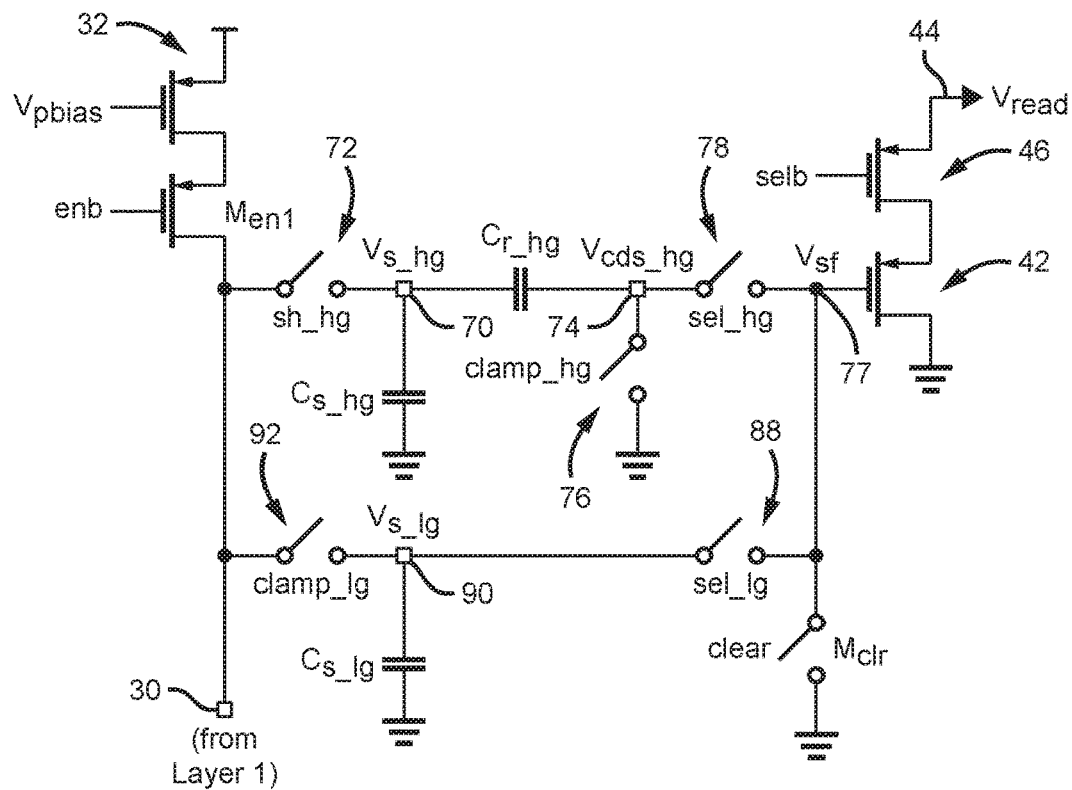
FIG. 10
FIG. 11
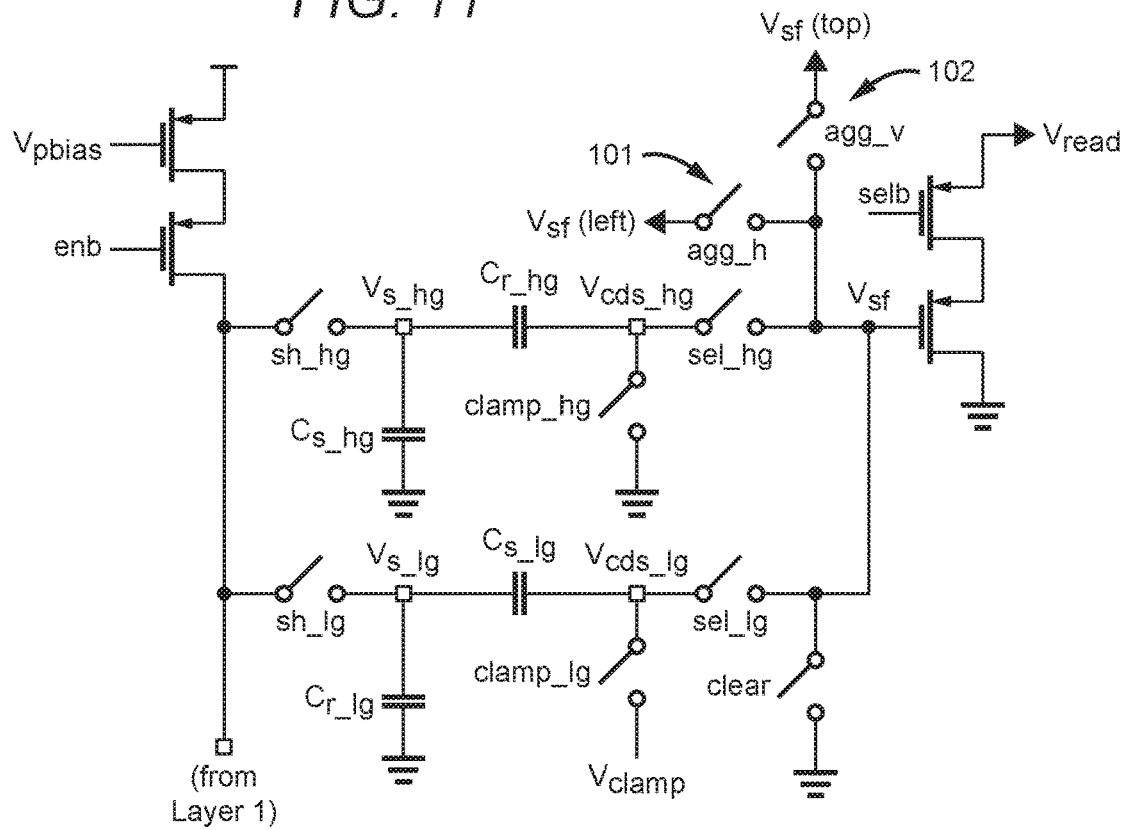

GLOBAL-SHUTTER VERTICALLY INTEGRATED PIXEL WITH HIGH DYNAMIC RANGE

BACKGROUND OF THE INVENTION

Field of the Invention

This invention relates generally to pixels in image sensors, and more particularly to vertically integrated (also known as 3D or stacked) pixels with high dynamic range for use in a pixel array operating in global shutter mode.

Description of the Related Art

An image sensor pixel array is known as having a global electronic shutter if all pixels in the pixel array start and end their exposure to light simultaneously. Global-shutter image sensors are superior to rolling-shutter image sensors because they are capable of imaging fast-moving objects without introducing image distortion. Another desirable pixel feature is having a high intrascene dynamic range so that a high-contrast scene can be captured without clipping. A third desirable pixel feature is the cancellation of stored kTC reset noise through correlated double sampling (CDS) and subtraction of the signal and reset levels, thereby achieving low read noise. A fourth desirable pixel feature is having a large optical fill factor, which is the ratio of the photosensitive area to the total pixel area. Lastly, it is often desirable that exposure (integration) and read occur simultaneously. Known pixels are unable to simultaneously provide all of these features.

SUMMARY OF THE INVENTION

A novel pixel is presented which is capable of providing global-shutter integrate-while-read operation, low read noise achieved through CDS, high dynamic range and high optical fill factor.

The present pixel is a vertically integrated pixel comprising at least two layers, with layer one comprising:

a pinned photodiode (PPD) which generates a photocurrent $I_{ph}$;

a transfer gate $M_{tg}$ connected in series between the PPD and a first node, the voltage at the first node being $V_{fd}$ and the total capacitance on the first node being $C_{fd}$, the transfer gate conducting in response to a control signal txb;

a low-gain select transistor $M_{lg}$ connected between the first node and a second node and conducting in response to a control signal lgb, the voltage at the second node being $V_{int}$;

a reset transistor $M_{rst}$ between the second node and a reset voltage $V_{rst}$, which conducts in response to a control signal rstb;

a capacitance $C_{int}$ connected between the second node and a first constant potential; and a source-follower transistor $M_{isf}$ whose source, gate and drain are connected to an output node, the first node and a second constant potential, respectively, such that the voltage at the output node follows $V_{fd}$ when the source-follower transistor is in a conducting state, the output node connected to another layer of the pixel. A plurality of such pixels may be arranged to form a pixel array which operates in global-shutter mode, such that all pixels in the array receive substantially the same control signals rstb, txb and lgb.

When properly arranged, a vertically integrated (3D) global-shutter PPD pixel is provided, which uses an overflow integration capacitor ($C_{int}$) and subthreshold conduction of the reset transistor ($M_{rst}$) for increased dynamic range. Global-shutter operation is made possible by storing the pixel output on sampling capacitors in another semiconductor layer at the end of integration. A high optical fill factor can be achieved by using backside illumination.

These and other features, aspects, and advantages of the present invention will become better understood with reference to the following drawings, description, and claims.

BRIEF DESCRIPTION OF THE DRAWINGS

FIG. 10 is a schematic diagram of another possible embodiment of additional processing circuitry that might be used with the pixel shown in FIG. 1.

FIG. 11 is an extension of the schematic diagram of FIG. 7 illustrating the addition of horizontal and/or vertical aggregation switches.

DETAILED DESCRIPTION OF THE INVENTION

Figure 1:
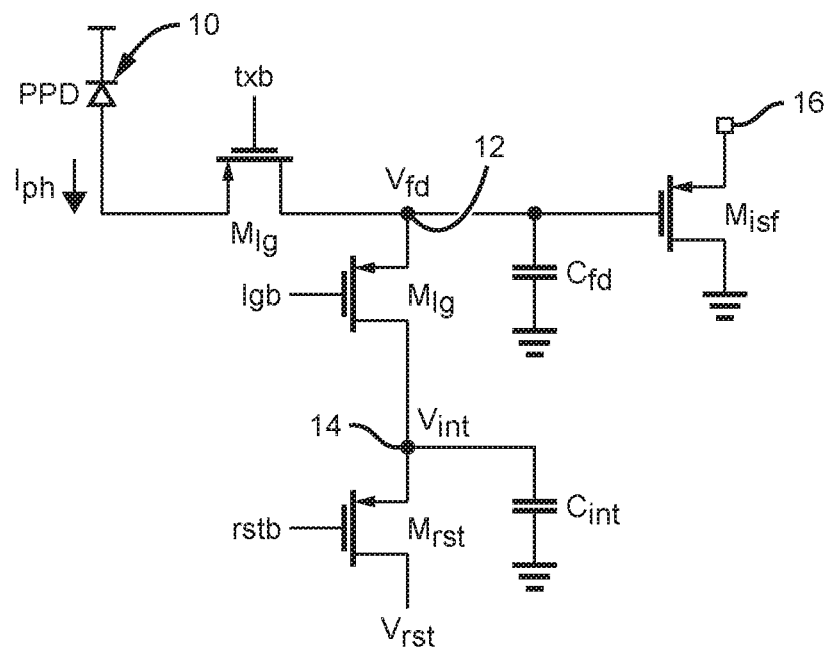
FIG. 1 is a schematic diagram of one possible embodiment of the first layer of a vertically integrated pixel in accordance with the present invention.

One possible embodiment of a vertically integrated pixel in accordance with the present invention is shown in FIG. 1. The present pixel comprises at least two layers; FIG. 1 depicts circuitry that would be present on the first layer. This circuitry illustrates a PMOS implementation with active-low control signals; an analogous NMOS implementation with active-high signals can also be realized. The circuitry comprises a pinned photodiode (PPD) 10 which generates a photocurrent $I_{ph}$. A transfer gate $M_{tg}$ is connected in series between PPD 10 and a first node 12, the voltage at node 12 being $V_{fd}$ and the total capacitance on node 12 being $C_{fd}$. Transfer gate $M_{tg}$ conducts in response to a control signal txb.

The circuitry further includes a low-gain select transistor $M_{lg}$ connected between first node 12 and a second node 14, which conducts in response to a control signal lgb, the voltage at second node 14 being a voltage $V_{int}$. A reset transistor $M_{rst}$ is between second node 14 and a reset voltage $V_{rst}$, which conducts in response to a control signal rstb. An "overflow" capacitance $C_{int}$ is connected between second node 14 and a first constant potential. A source-follower transistor $M_{isf}$ has its source, gate and drain connected to an output node 16, first node 12 and a second constant potential, respectively, such that the voltage at the output node 16 follows $V_{fd}$ when the source-follower transistor is in a conducting state. Output node 16 preferably connects to another layer of the pixel (discussed later). For a PMOS implementation, the first and second constant potentials and reset voltage $V_{rst}$ are suitably (though not necessarily) ground. For an NMOS implementation, the first and second constant potentials and reset voltage $V_{rst}$ are suitably (though not necessarily) equal to the supply voltage.

Note that though $C_{fd}$ is represented in FIG. 1 as a discrete device, it would not typically be a physically implemented capacitor element, but rather is the sum of the junction capacitances of transistors $M_{lg}$ and $M_{tg}$, the gate capacitance of transistor $M_{isf}$, and the parasitic capacitance at first node 12. $C_{int}$ is a physical capacitor element and is preferably a metal-insulator-metal (MIM) capacitor or metal-oxide-metal (MOM) capacitor. An array of pixels as described herein can be arranged to form an image sensor, which is backside illuminated so that a MIM or MOM $C_{int}$ capacitor and any metal routing layers do not block incident illumination and thus do not reduce the optical fill factor.

The pixel of FIG. 1 can simultaneously produce a high-gain (HG) linear output, for which photocurrent is integrated on $C_{fd}$, and a low-gain (LG) linear output, for which photocurrent is integrated on $C_{fd}C_{int}$. Furthermore, as will be shown later, for large photocurrents, the pixel can optionally produce a LG logarithmic output assuming that the gate of $M_{rst}$ (controlled by signal rstb) is biased appropriately during integration. The combination of HG and LG outputs extends the pixel dynamic range.

A plurality of pixels having a first layer as shown in FIG. 1 can be used to form a pixel array which operates in global-shutter mode so that all pixels in the pixel array start and end their exposure to light simultaneously. Global-shutter operation can be achieved if all pixels in the array receive substantially the same control signals rstb, txb and lgb.

Figure 2:
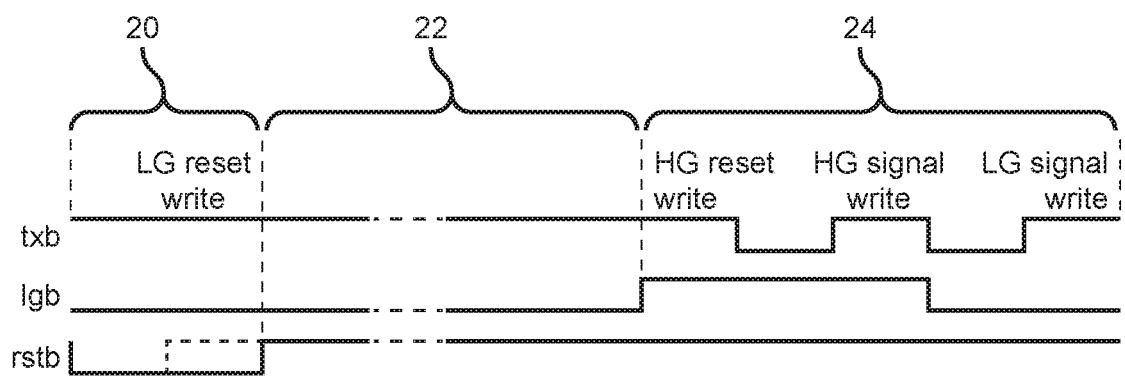
FIG. 2 is a timing diagram illustrating the operation of control signals used with the schematic diagram shown in FIG. 1.

A timing diagram illustrating the operation of control signals txb, lgb, and rstb is shown in FIG. 2. The frame period can be subdivided into three consecutive phases: a reset phase (20), an integration phase (22) and a write phase (24). In this context a global write operation, which occurs simultaneously for all pixels of the pixel array, is the transfer and storage of sampled voltages from the first layer of the pixel as shown in FIG. 1 to capacitors located in another layer. The circuit activity during the three phases is as follows.

During the reset phase (20):
control signal txb is set such that transfer gate $M_{tg}$ is not conducting;
control signals lgb and rstb are set such that low-gain select transistor $M_{lg}$ and reset transistor $M_{rst}$ turn on and reset $C_{fd}$ and $C_{int}$ to a voltage $V_{rst}$; and
the voltage at output node 16 is written and stored as the "low gain" (LG) reset level while $M_{rst}$ is still on or after $M_{rst}$ turns off.

During the integration phase (22):
control signal lgb is set such that low-gain select transistor $M_{lg}$ remains on thereby shorting nodes 12 and 14;
control signal rstb is set at a level such that reset transistor $M_{rst}$ remains off either unconditionally or until $V_{int}$ exceeds a certain level;
charge is collected and stored in PPD 10 until it exceeds a threshold level $Q_t$; if charge exceeds $Q_t$, $M_{tg}$ leaks and the overflow charge is collected on $C_{int}$ and $C_{fd}$.

During the write phase (24):
control signal lgb is set such that low-gain select transistor $M_{lg}$ turns off and the voltage at output node 16 is written and stored as the "high gain" (HG) reset level;
control signal txb is pulsed such that the PPD charge is transferred to $C_{fd}$, after which the voltage at output node 16 is written and stored as the HG signal level; and
control signal lgb is set such that low-gain select transistor $M_{lg}$ turns on, control signal txb is pulsed thereby combining the charges on PPD, $C_{int}$ and $C_{fd}$, and the voltage at output node 16 is written and stored as the LG signal level.

In order to better understand the formation of the LG signal level, let us examine the voltage $V_{int}$ during the integration phase (22). For a PMOS implementation of the first pixel layer, when the integrated charge $I_{ph}t > Q_t$, the transfer gate $M_{tg}$ leaks and the overflow charge integrated on $C_{int}+C_{fd}$ is:

$$V_{int}(t) = V_{rst} + \frac{I_{ph}t - Q_t}{C_{int} + C_{fd}}.$$

After the charges on PPD, $C_{int}$ and $C_{fd}$ are combined during the write phase (24), the LG signal level at node 12 equals:

$$V_{fd,LG} = V_{rst} + \frac{I_{ph}t}{C_{int} + C_{fd}}.$$

This represents the LG linear output. It is possible to obtain also a LG logarithmic output if the reset signal applied to the gate of PMOS FET $M_{rst}$ has a high level $V_{hi\_rstb} < V_{dd}$, where $V_{dd}$ is the pixel supply voltage. During the integration phase (22) if $V_{int}(t) > V_{hi\_rstb}$, $M_{rst}$ is biased in subthreshold by $I_{ph}$, such that $V_{int}$ is constant with time and:

$$V_{int}(I_{ph}) = V_{hi\_rstb} + \frac{nkT}{q_e} \ln \frac{I_{ph}}{I_o},$$

where $I_o$ is proportional to W/L of reset transistor $M_{rst}$, k is Boltzmann's constant, T is absolute temperature, $q_e$ is the charge of the electron, and n is a non-ideality factor.

For an NMOS implementation of the first pixel layer, the overflow charge integrated on $C_{int}+C_{fd}$ is:

$$V_{int}(t) = V_{rst} - \frac{I_{ph}t - Q_t}{C_{int} + C_{fd}}.$$

After the charges on PPD, $C_{int}$ and $C_{fd}$ are combined during the write phase (24), the LG signal level at node 12 equals:

$$V_{fd,LG} = V_{rst} - \frac{I_{ph}t}{C_{int} + C_{fd}}.$$

This represents the LG linear output. It is possible to obtain also a LG logarithmic output if the reset signal applied to the gate of NMOS FET $M_{rst}$ has a low level $V_{lo\_rst}>0$. During the integration phase (22) if $V_{int}(t)<V_{lo\_rst}$, $M_{rst}$ is biased in subthreshold by $I_{ph}$, such that $V_{int}$ is constant with time and:

$$V_{int}(I_{ph}) = V_{lo\_rst} - \frac{nkT}{q_e}\ln\frac{I_{ph}}{I_o}.$$

In summary, during the frame period as shown in FIG. 2, the HG and LG signal and reset levels are transferred and stored from the first pixel layer to another pixel layer. The LG reset level is stored during the reset phase and is read out during the integration phase of the current frame (assuming integrate-while-read operation). On the other hand, the LG signal level is stored after the integration phase and so it will be read out during the following frame. Thus, if correlated double sampling (CDS) of the LG output is desired (involving subtraction of the LG reset level from the LG signal level), then full frame memory is needed to store the LG reset frame until the LG signal frame gets read out. For this reason the LG CDS subtraction is preferably done off chip by subtracting digitally the LG reset frame from the LG signal frame. For some applications requiring large well fill, the LG shot noise is far greater than the LG reset noise and hence performing LG CDS may not be necessary. In this case it may be preferable to perform uncorrelated instead of correlated double sampling (UDS instead of CDS) of the LG signal. In the UDS case (which cancels pixel fixed-pattern noise (FPN) and suppresses 1/f noise but does not cancel the kTC reset noise), there is no need for full frame memory. During each row readout, the LG reset level of the current frame can be subtracted from the LG signal level of the previous frame.

As noted above, during reset phase (20), the voltage at output node 16 is written and stored as the LG reset level while $M_{rst}$ is still on or after $M_{rst}$ turns off. In FIG. 2, the former case is indicated with the solid rstb curve while the latter case is indicated with the dashed rstb curve. If CDS of the LG output is performed, the LG reset level is preferably written after $M_{rst}$ turns off so that the kTC reset noise stored on $C_{int}$ is sampled. In the case of uncorrelated double sampling (UDS) of the LG output, the LG reset level can be written while $M_{rst}$ is still on or after $M_{rst}$ turns off. If $M_{rst}$ turns off before the LG reset write, it is possible that $C_{int}$ may discharge slightly under high-illumination conditions thereby leading to an error in the sampled reset level; keeping $M_{rst}$ on during LG reset write prevents $C_{int}$ discharge.

If the amount of photocurrent $I_{ph}$ integrated during the integration phase is $Q_{int}$, the image sensor using the pixel of FIG. 1 provides a HG output and a LG output such that:

the HG output is equal to the difference between the HG signal level and the HG reset level, the HG output being linear and inversely proportional to $C_{fd}$ if $Q_{int}$ is less than a first threshold;

the LG output is equal to the LG signal level or to the difference between the LG signal level and the LG reset level (in case of CDS or UDS), the LG output being linear and inversely proportional to $(C_{int}+C_{fd})$ if $Q_{int}$ is less than a second threshold. If $M_{rst}$ is properly biased, the LG output is logarithmically dependent on $I_{ph}$ if $Q_{int}$ is equal to or greater than the second threshold.

A system employing the pixel embodiment may include additional circuitry which subtracts the HG reset level from the HG signal level to effect CDS and form the HG output. This circuitry may reside in the pixel, in the column, or off-chip. Similarly, a system employing the pixel embodiment may include additional circuitry which subtracts the LG reset level from the LG signal level to effect CDS and form the LG output; such circuitry may comprise full frame memory. Similarly, a system employing the pixel embodiment may include additional circuitry which subtracts the LG reset level from the LG signal level to effect UDS and form the LG output. When so arranged, during each row readout, the LG reset level of the current frame is subtracted from the LG signal level of the previous frame. Such circuitry may reside in the pixel, in the column, or off-chip.

The pixel preferably further comprises circuitry that produces a combined high dynamic range (HDR) pixel output which is equal to the HG output if the HG output is not saturated, and is equal to the LG output if the HG output is saturated. This circuitry can be implemented in each column below the pixel array. It may consist of a comparator and analog multiplexer. Alternatively, it may be a part of a column-parallel single-slope ADC, wherein the HG and LG outputs are fed to two different comparators such that the HG and LG pixel outputs are compared against a ramp voltage. A selection is made between the HG and LG comparator outputs depending on the time at which each comparator trips. The selected comparator output is used to latch the value of a counter, which is a digital representation of the HG or LG pixel output.

Apart from the circuitry shown in FIG. 1, the vertically integrated pixel consists of the following additional elements:

a bias transistor that provides bias current to source-follower transistor $M_{isf}$;

sampling capacitors and processing circuitry located on one or more additional layers. The processing circuitry is arranged to store (write) the HG and LG signal and reset levels on the sampling capacitors as these levels become available on output node 16. Consistent with global-shutter operation, the writing of the HG and LG signal and reset levels on the sampling capacitors occurs simultaneously for all pixels of the pixel array.

Another role of this processing circuitry is to route the voltages stored on the sampling capacitors to at least one read node, buffer the voltage on this read node, and multiplex it on at least one vertical bus line during pixel array readout. The pixel array readout normally occurs during the integration phase (22) for integrate-while-read operation.

Figure 3:
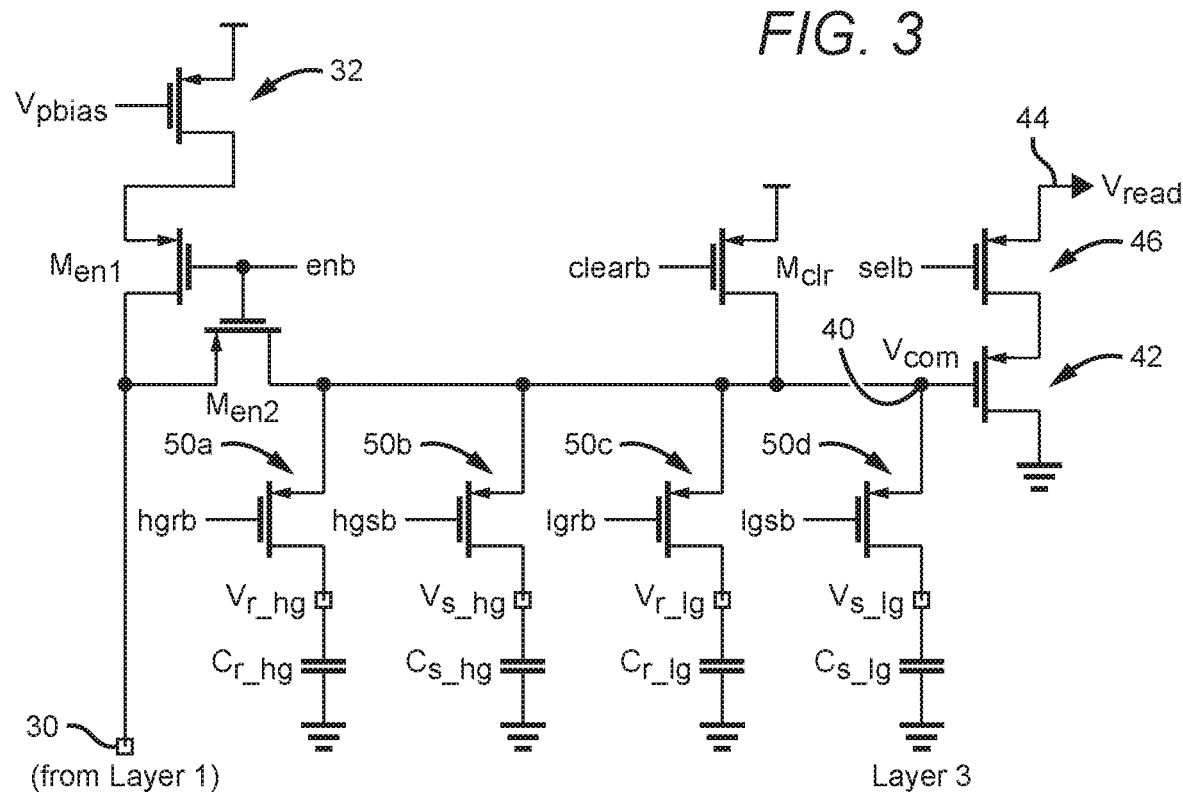
FIG. 3 is a schematic diagram of one possible embodiment of additional processing circuitry that might be used with the pixel shown in FIG. 1.

FIG. 3 shows one possible embodiment of the bias transistor, sampling capacitors and processing circuitry. A node 30 is coupled to output node 16 of FIG. 1, and a bias transistor 32 (driven with a voltage $V_{pbias}$) provides bias current to source-follower transistor $M_{isf}$ of FIG. 1 when transistor $M_{en1}$ enabled with a signal enb. A transistor $M_{en2}$, also controlled by enb, couples node 30 to read node 40, the voltage at which is $V_{com}$. The charge on read node 40 is cleared by coupling read node 40 to a constant potential such as ground or to the supply voltage (as shown) through transistor $M_{clr}$. Voltage $V_{com}$ is buffered by source follower 42 and is read out on vertical bus 44 when row select switch 46 is closed (signal selb is low). Sampling capacitors $C_{r\_hg}$, $C_{s\_hg}$, $C_{r\_lg}$, and $C_{s\_lg}$, which store the HG reset level, the HG signal level, the LG reset level, and the LG signal level, respectively, are coupled to read node 40 through sampling switches 50a-50d. The bottom plates of the sampling capacitors are connected to a constant potential such as ground. Sampling switches 50a-50d are controlled by signals hgrb, hgsb, lgrb and lgsb. Only one of the four sampling switches is closed at a time to either store (write) a voltage to a sampling capacitor or to read the stored voltage from a particular sampling capacitor.

Figure 4:
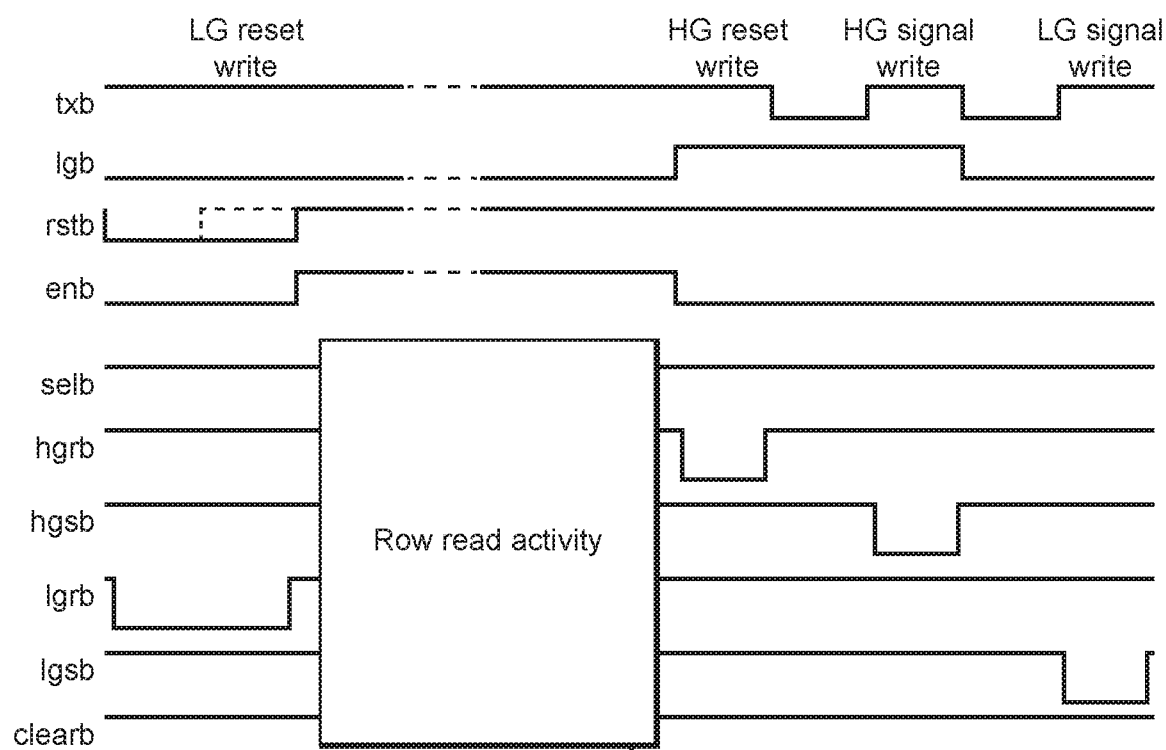
FIG. 4 is an exemplary timing diagram illustrating possible global signal timing for the circuitry shown in FIGS. 1 and 3.
Figure 5:
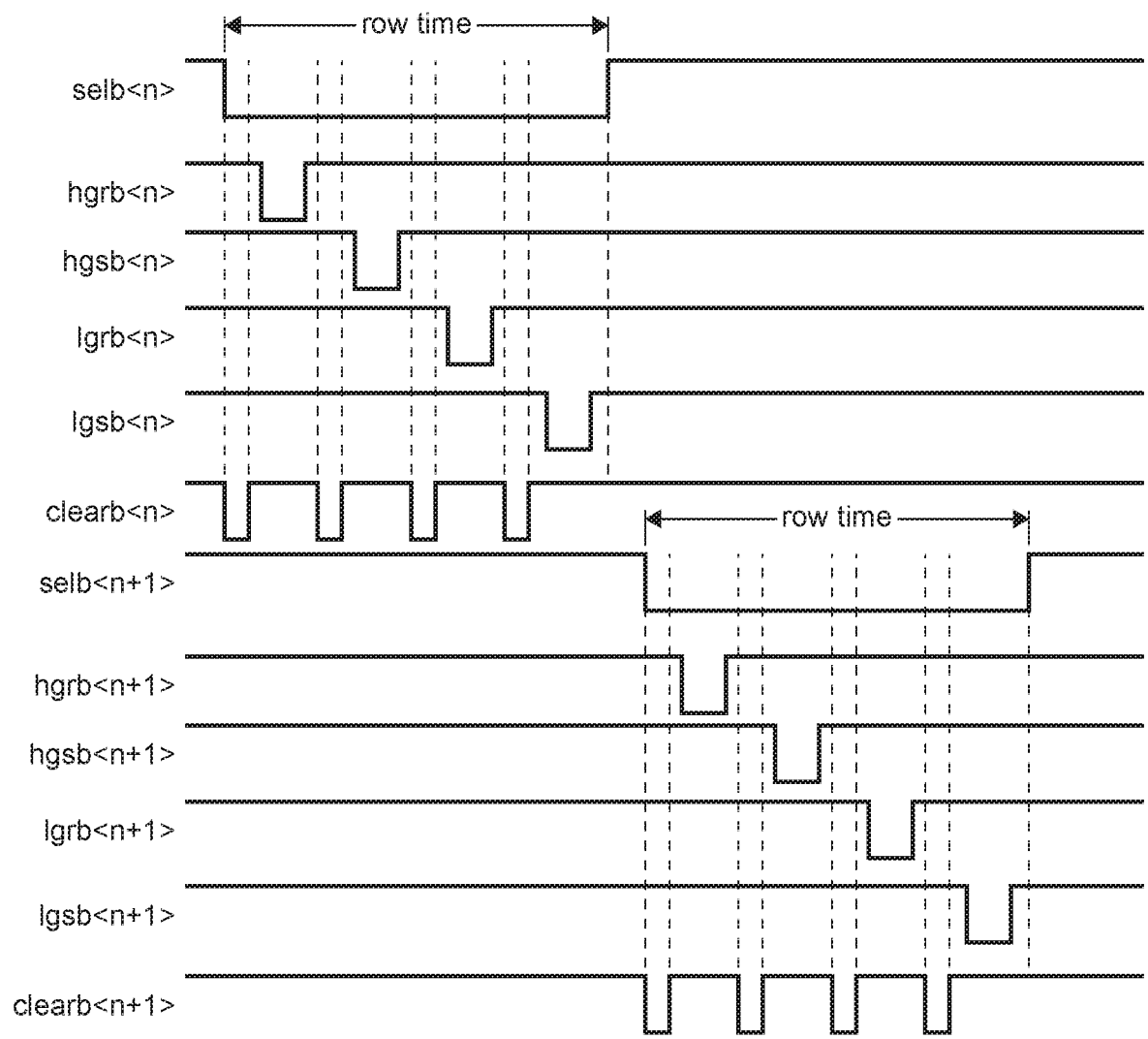
FIG. 5 is an exemplary timing diagram detailing row read activity timing for the circuitry shown in FIGS. 1 and 3.

FIG. 4 illustrates the signal timing for operating the pixel circuitry of FIGS. 1 and 3. Note that all signal transitions shown in FIG. 4 are global, i.e. they occur simultaneously for all pixels in the pixel array. The row read activity, wherein pixel rows are read out one at a time, preferably occurs during the integration phase for integrate-while-read operation and is shown in FIG. 5. When a HG or LG reset or signal level needs to be written to a respective sampling capacitor, transistors $M_{en1}$ and $M_{en2}$ are both enabled by keeping signal enb low, and the respective sampling switch 50a-50d is closed by keeping hgrb, hgsb, lgrb or lgsb low. In this way the voltage on the respective sampling capacitor becomes equal to $V_{com}$, which is itself equal to the voltage at node 30 driven by source follower $M_{isf}$.

The signal timing during pixel array readout is shown in FIG. 5 for two consecutive rows n and n+1. The index after the signal name (located inside < >) indicates that it is applied to the pixels in row i (where i can be equal to n or n+1). During readout signal enb is kept high and transistors $M_{en1}$ and $M_{en2}$ are off. For a duration of one row read time, signal selb<i> is kept low to select row i through row select switch 46. The HG and LG signal and reset levels are read out sequentially during the row time. Before each HG or LG reset or signal level is read out, the charge on read node 40 is cleared by pulsing signal clearb<i> thereby enabling $M_{clr}$. The respective sampling switch 50a-50d is then closed by pulsing low hgrb<i>, hgsb<i>, lgrb<i> or lgsb<i> thus making the voltage $V_{com}$ approximately equal to the voltage stored on the respective sampling capacitor. Voltage $V_{com}$ is buffered by source follower 42 and read out on vertical bus 44. FIGS. 3, 4, and 5 assume that there is only one read node per pixel, whose voltage is buffered and read out on only one vertical read bus line per column. In this case all four voltage quantities (HG and LG signal and reset levels) are read out sequentially as shown in FIG. 5. It is also possible to have two or more read nodes per pixel and a matching number of vertical bus lines per column. In that case two or more voltage quantities can be read out in parallel.

The number of sampling capacitors in the exemplary embodiment shown is 4 to store the HG and LG reset and signal levels. In case of large well fill in LG mode and when canceling FPN is not a priority, it may be advantageous to process only the LG signal level and not the LG reset level. This requires only 3 sampling capacitors instead of 4 and capacitor $C_{r\_lg}$ and sampling switch 50c are not present.

Figure 13:
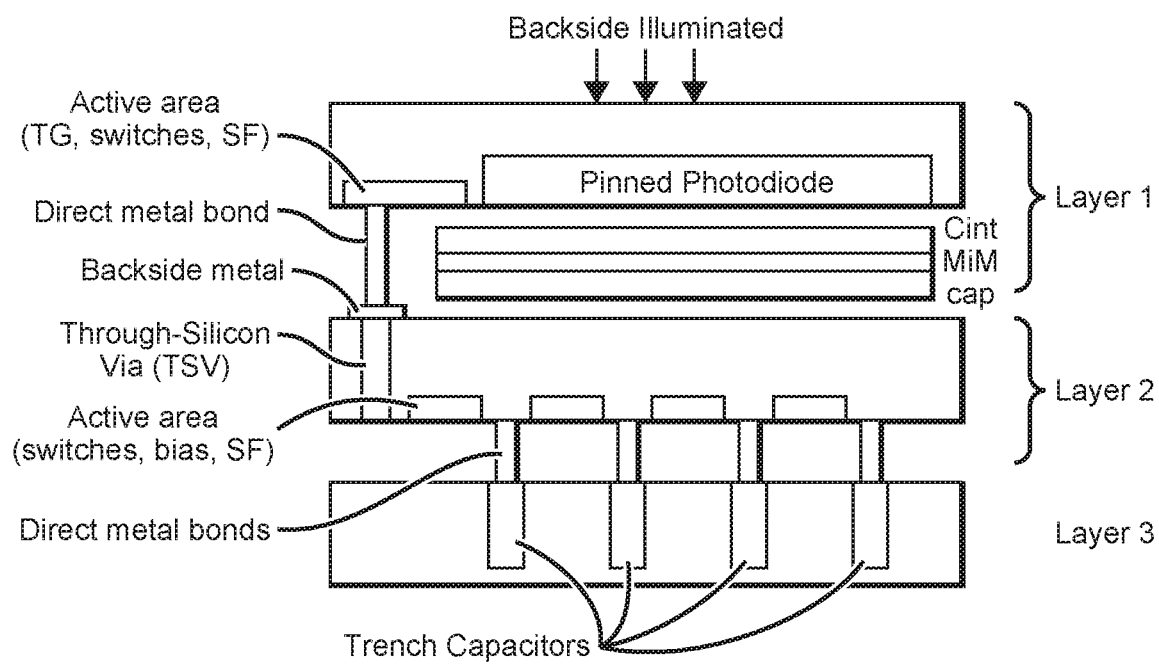
FIG. 13 is an exemplary cross section of a vertically integrated pixel showing the implementation of circuit elements of the circuitry of FIGS. 1 and 3.

In a preferred embodiment of a vertically integrated pixel, the circuit of FIG. 1 is implemented on the first layer, all transistors of FIG. 2 are implemented on a second layer and the sampling capacitors $C_{r\_hg}$, $C_{s\_hg}$, $C_{r\_lg}$, and $C_{s\_lg}$ are implemented on a third layer. The sampling capacitors can be realized as trench capacitors; four direct metal bonds per pixel are required. This arrangement is illustrated in the exemplary pixel cross section in FIG. 13. Because the PPD is backside illuminated, the metal routing and capacitor $C_{int}$ (implemented as MIM or MOM) do not reduce the optical fill factor.

Figure 6:
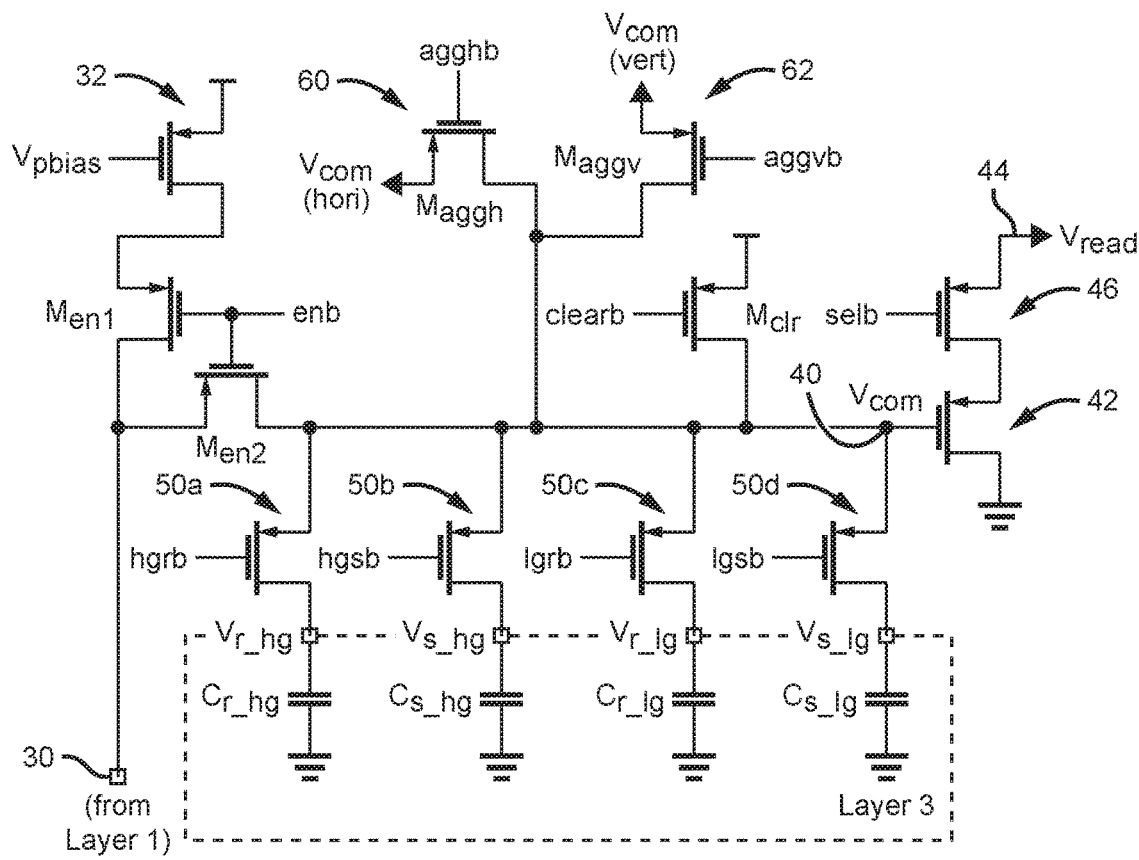
FIG. 6 is an extension of the schematic diagram of FIG. 3 illustrating the addition of horizontal and/or vertical aggregation switches.

The processing circuitry may further include at least one aggregation switch that connects the read nodes of neighboring pixels in the horizontal and/or vertical direction; one possible embodiment is shown in FIG. 6. An aggregation switch 60 for the horizontal direction is preferably implemented with a FET $M_{aggh}$ and controlled with a control signal agghb, and an aggregation switch 62 for the vertical direction is preferably implemented with a FET $M_{aggv}$ and controlled with a control signal aggvb. Horizontal and/or vertical pixel aggregation is preferably carried out in the charge domain by enabling switches $M_{aggh}$ and/or $M_{aggv}$, respectively. These switches are closed during the row read activity shown in FIG. 5 to effect pixel aggregation and are open outside of this activity. With n×n aggregation, 1 of n rows and 1 of n columns are read out, and the overall photocurrent and charge capacity are $n^2$ larger.

Figure 7:
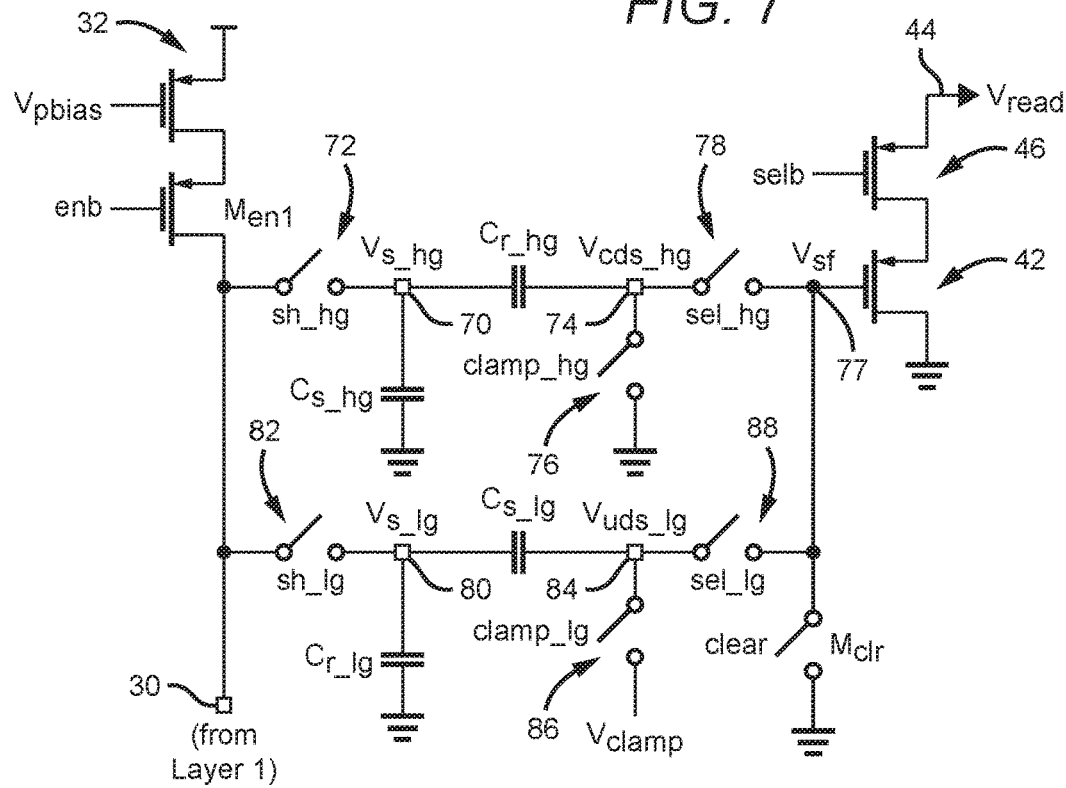
FIG. 7 is a schematic diagram of another possible embodiment of additional processing circuitry that might be used with the pixel shown in FIG. 1.

One possible alternative embodiment of the bias transistor, sampling capacitors, and processing circuitry that performs in-pixel subtraction of the signal and reset levels for both HG and LG is shown in FIG. 7. A node 30 is coupled to output node 16 of FIG. 1, and a bias transistor 32 (driven with a voltage $V_{pbias}$) provides bias current to source-follower transistor $M_{isf}$ of FIG. 1 when transistor $M_{en1}$ is enabled with a signal enb. The charge on read node 77 is cleared by coupling read node 77 to a constant potential such as ground (as shown) through switch $M_{clr}$ controlled by signal clear. Voltage $V_{sf}$ at read node 77 is buffered by source follower 42 and is read out on vertical bus 44 when row select switch 46 is closed (signal selb is low). The circuit further consists of four sampling capacitors: $C_{s\_hg}$ and $C_{r\_hg}$ are used to store the HG signal and reset levels and perform HG CDS, and $C_{s\_lg}$ and $C_{r\_lg}$ are used to store the LG signal and reset levels and perform LG UDS. The HG sampling capacitors $C_{s\_hg}$ and $C_{r\_hg}$ are connected to a shared HG node 70 coupled to node 30 (and thus to output node 16 of FIG. 1) through a HG sampling switch 72. One of sampling capacitors $C_{s\_hg}$ and $C_{r\_hg}$ is connected to a constant potential (typically, though not necessarily, ground) and the other is connected to a HG CDS node 74. The HG CDS node is coupled to a reference voltage (here, ground) through a HG clamp switch 76, and to a read node 77 through HG select switch 78.

The LG sampling capacitors $C_{s\_lg}$ and $C_{r\_lg}$ are connected to a shared LG node 80 coupled to node 30 (and thus to output node 16 of FIG. 1) through a LG sampling switch 82. One of sampling capacitors $C_{s\_lg}$ and $C_{r\_lg}$ is connected to a constant potential (typically, though not necessarily, ground) and the other is connected to a LG UDS node 84. The LG UDS node is coupled to a reference voltage (here, $V_{clamp}$) through a LG clamp switch 86, and to read node 77 through a LG select switch 88.

Figure 8:
FIG. 8 is an exemplary timing diagram illustrating possible global signal timing for the circuitry shown in FIGS. 1 and 7.
Figure 9:
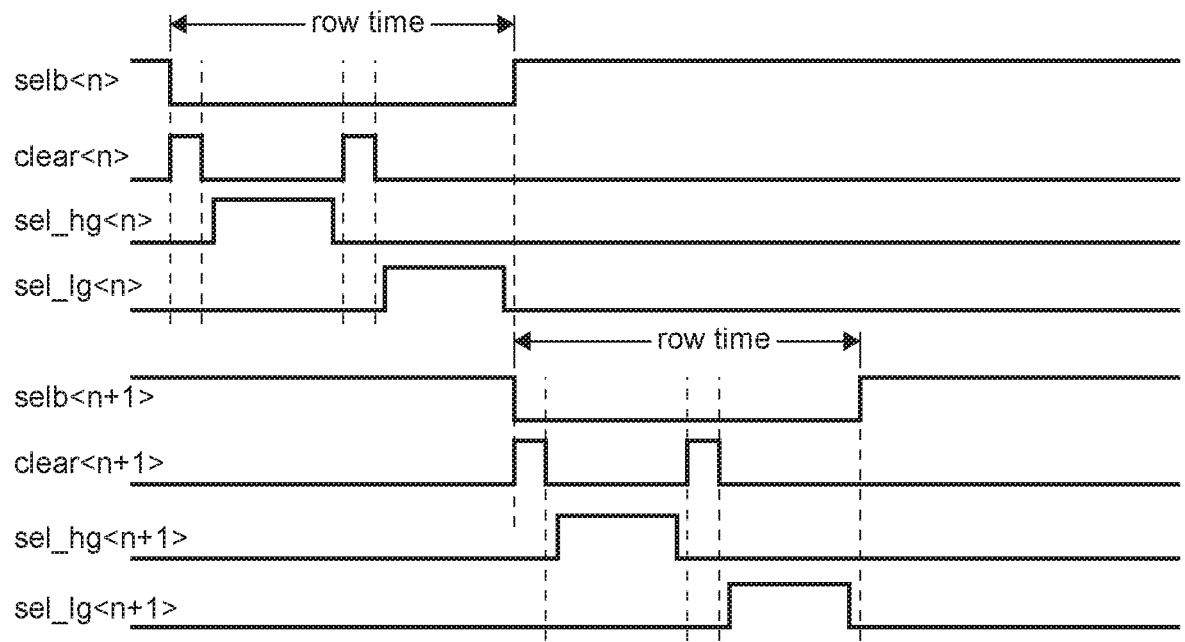
FIG. 9 is an exemplary timing diagram detailing row read activity timing for the circuitry shown in FIGS. 1 and 7.

An exemplary diagram illustrating global signal timing for the circuitry shown in FIGS. 1 and 7 is shown in FIG. 8, with the row read activity timing (showing the signal timing during read of rows n and n+1) detailed in FIG. 9. During global signal timing, signals sel_hg, sel_lg and clear are low and switches 78, 88 and $M_{clr}$, respectively, are open. Also during global signal timing signal selb is low and switch 46 is open. While the HG reset level is available at node 30, switches 72 and 76 are both closed (sh_hg and clamp_hg are both high) and HG CDS node 74 is clamped to ground. Next, HG clamp switch 76 opens (clamp_hg goes low) and then the voltage at node 30 switches to the HG signal level. As a result, the voltage at HG CDS node 74 ($V_{cds\_hg}$) becomes approximately equal to:

$$V_{cds\_hg} = V_{sig\_hg} - V_{rst\_hg}.$$

While the LG signal level of the current frame is available at node 30, switches 82 and 86 are both closed (sh_lg and clamp_lg are both high) and LG UDS node 84 is clamped to $V_{clamp}$. Next, LG clamp switch 86 opens (clamp_hg goes low) and then the voltage at node 30 switches to the LG reset level of the next frame. As a result, the voltage at LG UDS node 84 ($V_{uds\_lg}$) becomes approximately equal to:

$$V_{uds\_lg} = V_{clamp} - (V_{sig\_lg} - V_{rst\_lg}).$$

The signal activity during pixel array readout is shown in FIG. 9. The index after the signal name (located inside < >) indicates that it is applied to the pixels in row i (where i can be equal to n or n+1). At this time signal enb is kept high and transistor $M_{en1}$ is off. Also the HG sampling switch 72, the HG clamp switch 76, the LG sampling switch 82, and the LG clamp switch 86 are all open (signals sh_hg, clamp_hg, sh_lg, and clamp_lg are all low). For a duration of one row read time, signal selb<i> is kept low to select row i through row select switch 46. Before each read, the charge on read node 77 is cleared by pulsing signal clear<i>, thereby enabling $M_{clr}$. Voltages $V_{cds\_hg}$ and $V_{uds\_lg}$ are read out sequentially during the row time by first turning on HG select switch 78 (signal sel_hg<i> is high) and then turning on LG select switch 88 (signal sel_lg<i> is high). Thus the voltage $V_{sf}$ at read node 77 becomes first equal to approximately $V_{cds\_hg}$ and then to $V_{uds\_lg}$. Voltage $V_{sf}$ is buffered by source follower 42 and read out on vertical bus 44. As an alternative implementation, it is possible to have two read nodes, two source followers and two vertical read buses such that voltages $V_{cds\_hg}$ and $V_{uds\_lg}$ are read out in parallel.

In a preferred embodiment of a vertically integrated pixel, the circuit of FIG. 1 is implemented on the first layer, all transistors of FIG. 7 are implemented on a second layer and the sampling capacitors $C_{r\_hg}$, $C_{s\_hg}$, $C_{r\_lg}$, and $C_{s\_lg}$ are implemented on a third layer. The sampling capacitors are preferably implemented as trench capacitors; four direct metal bonds per pixel are required.

An alternative embodiment of the implementation shown in FIG. 7, except with no LG reset level storage, is shown in FIG. 10. This embodiment is suitable when only the LG signal level is processed. Here, the sampling capacitor $C_{s\_lg}$ is connected between a LG sampling node 90 and a constant potential (typically, though not necessarily, ground), and is coupled to node 30 (and therefore to output node 16 of FIG. 1) through a LG clamp switch 92. The LG sampling node is coupled to read node 77 through LG select switch 88. The circuit operation and signal timing are identical to those of FIGS. 7, 8, and 9, except that signal sh_lg is not used.

As before, capacitors $C_{r\_hg}$, $C_{s\_hg}$, and $C_{s\_lg}$ may be implemented as trench capacitors on a third layer; three direct metal bonds per pixel are required.

Figure 12:
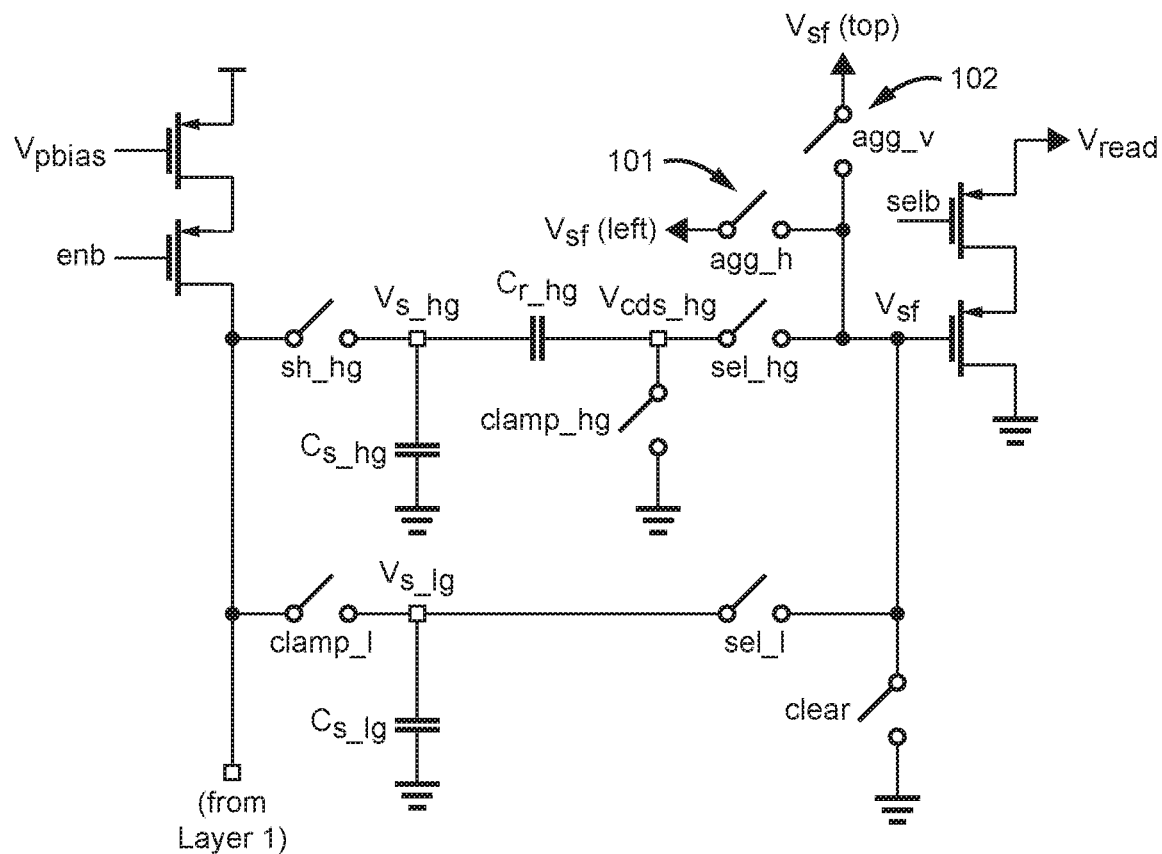
FIG. 12 is an extension of the schematic diagram of FIG. 10 illustrating the addition of horizontal and/or vertical aggregation switches.

FIGS. 11 and 12 illustrate the addition of horizontal and/or vertical aggregation switches to the respective embodiments of FIGS. 7 and 10. Aggregation switches 101 and 102 controlled by signals agg_h and agg_v, respectively, connect the read nodes of neighboring pixels in the horizontal and vertical directions, respectively. Horizontal and/or vertical pixel aggregation is preferably carried out in the charge domain by closing switches 101 and/or 102, respectively, during the row read activity shown in FIG. 9. These switches remain open outside of this activity.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A vertically integrated pixel comprising at least two layers, with layer one comprising:

a pinned photodiode (PPD) which generates photocurrent $I_{ph}$;

a transfer gate $M_{tg}$ connected in series between said PPD and a first node, the voltage at said first node being $V_{fd}$ and the total capacitance on said first node being $C_{fd}$, said transfer gate conducting in response to a control signal txb;

a low-gain select transistor $M_{lg}$ connected between said first node and a second node, said low-gain select transistor conducting in response to a control signal lgb, the voltage at said second node being a voltage $V_{int}$;

a reset transistor $M_{rst}$ connected between said second node and a reset voltage $V_{rst}$, said reset transistor conducting in response to a control signal rstb;

a capacitance $C_{int}$ connected between said second node and a first constant potential; and a source-follower transistor $M_{isf}$ whose source, gate and drain are connected to an output node, said first node and a second constant potential, respectively, such that the voltage at said output node follows $V_{fd}$ when said source-follower transistor is in a conducting state, said output node connected to another layer of said pixel.

2. The pixel of claim 1, wherein a plurality of said pixels are arranged to form a pixel array, said pixel array operating in global shutter mode such that all pixels of said pixel array receive substantially the same control signals rstb, txb and lgb.

3. The pixel of claim 1, said pixel arranged such that:

during a reset phase:
   control signal txb is set such that said transfer gate is not conducting;
   control signals lgb and rstb are set such that said low-gain select and reset transistors turn on and reset $C_{fd}$ and $C_{int}$ to a voltage $V_{rst}$; and
   the voltage at said output node is written and stored as the "low gain" (LG) reset level while said reset transistor is still on or after said reset transistor turns off; and during an integration phase, which follows said reset phase:
   control signal lgb is set such that said low-gain select transistor remains on thereby shorting said first and second nodes;
   control signal rstb is set such that said reset transistor remains off either unconditionally or until the charge on $C_{int}$ and $C_{fd}$ exceeds a certain level;
   charge is collected and stored in said PPD until it exceeds a threshold level $Q_t$; if charge exceeds $Q_t$, $M_{tg}$ leaks and the overflow charge is collected on $C_{int}$ and $C_{fd}$; and during a write phase, which follows said integration phase:
   control signal lgb is set such that said low-gain select transistor turns off and the voltage at said output node is written and stored as the "high gain" (HG) reset level;
   control signal txb is pulsed such that the PPD charge is transferred to $C_{fd}$ after which the voltage at said output node is written and stored as the HG signal level;
   control signal lgb is set such that said low-gain select transistor turns on, control signal txb is pulsed thereby combining the charge on PPD, $C_{int}$ and $C_{fd}$, and the voltage at said output node is written and stored as the LG signal level.

4. The pixel of claim 3, wherein said LG reset level is written during said reset phase after said reset transistor turns off when performing correlated double sampling (CDS).

5. The pixel of claim 3, wherein the amount of photocurrent $I_{ph}$ integrated during said integration phase is $Q_{int}$, said pixel providing a HG output and a LG output such that:
   said HG output is equal to the difference between said HG signal level and said HG reset level, said HG output being linear and inversely proportional to $C_{fd}$ if $Q_{int}$ is less than a first threshold;
   said LG output is equal to said LG signal level or to the difference between said LG signal level and said LG reset level, said LG output being linear and inversely proportional to $(C_{int}+C_{fd})$ if $Q_{int}$ is less than a second threshold.

6. The pixel of claim 5, wherein said LG output is logarithmically dependent on said photocurrent $I_{ph}$ if $Q_{int}$ is equal to or greater than said second threshold.

7. The pixel of claim 5, further comprising circuitry that produces a combined pixel output,
   said combined pixel output being proportional to said HG output if said HG output is not saturated, and
   said combined pixel output being proportional to said LG output if said HG output is saturated.

8. The pixel of claim 3, wherein said pixel has an associated supply voltage $V_{dd}$ and said reset transistor $M_{rst}$ is a PMOS FET, said pixel further arranged such that:
   during said integration phase:
      said reset transistor gate voltage is at a voltage $V_{hi\_rstb} < V_{dd}$;
      if charge exceeds said threshold level $Q_t$, the voltage at said second node $V_{int}$ is given by:

$$V_{int}(t) = V_{rst} + \frac{I_{ph}t - Q_t}{C_{int} + C_{fd}};$$

and
   if $V_{int}(t) > V_{hi\_rstb}$, $M_{rst}$ is biased in subthreshold by $I_{ph}$, such that $V_{int}$ is constant with time and:

$$V_{int}(I_{ph}) = V_{hi\_rstb} + \frac{nkT}{q_e}\ln\frac{I_{ph}}{I_o},$$

where $I_o$ is proportional to W/L of said reset transistor $M_{rst}$.

9. The pixel of claim 3, wherein said reset transistor $M_{rst}$ is a NMOS FET, said pixel further arranged such that:
   during said integration phase:
      said reset transistor gate voltage is at a voltage $V_{lo\_rst} > 0$;
      if charge exceeds said threshold level $Q_t$, the voltage at said second node $V_{int}$ is given by:

$$V_{int}(t) = V_{rst} - \frac{I_{ph}t - Q_t}{C_{int} + C_{fd}};$$

and
   if $V_{int}(t) < V_{lo\_rst}$, $M_{rst}$ is biased in subthreshold by $I_{ph}$, such that $V_{int}$ is constant with time and $$V_{int}(I_{ph}) = V_{lo\_rst} - \frac{nkT}{q_e}\ln\frac{I_{ph}}{I_o},$$

where $I_o$ is proportional to W/L of said reset transistor $M_{rst}$.

10. The pixel of claim 3, further comprising:
   a bias transistor that provides bias current to said source-follower transistor;
   sampling capacitances and processing circuitry located on a different layer from said layer one;
   said processing circuitry arranged to store at least said HG reset level, said HG signal level, and said LG signal level on said sampling capacitances as said levels become available on said output node; and
   said processing circuitry further arranged to route the voltages stored on said sampling capacitances to at least one read node, buffer the voltage on said at least one read node, and multiplex it on at least one vertical bus line during pixel array readout, said pixel array readout occurring during said integration phase.

11. The pixel of claim 10, forming a pixel array consisting of rows and columns, wherein:
   the process of storing each of said HG reset level, said HG signal level, and said LG signal level on said sampling capacitances occurs simultaneously for all pixels of said pixel array;
   said pixel processing circuitry further comprises at least one read buffer and at least one row select switch controlled by a row select signal;
   the input of said at least one read buffer is connected to said at least one read node;
   the output of said at least one read buffer is coupled to said at least one vertical bus line through said row select switch;
   the row select signal selects one row of said pixel array for a duration of one row time such that, for each pixel in the selected row, the buffered voltage on said at least one read node is multiplexed on said at least one vertical bus line; and
   pixel rows are selected sequentially during said pixel array readout until all pixels of said pixel array are read out.

12. The pixel of claim 11, wherein said at least one read buffer is a source follower.

13. The pixel of claim 11, wherein one plate of said sampling capacitances is common and is connected to a third constant potential.

14. The pixel of claim 13, wherein said processing circuitry comprises switching elements coupled to said sampling capacitances, said switching elements actuated to store at least said HG reset level, said HG signal level, and said LG signal level, on said sampling capacitances.

15. The pixel of claim 14, wherein said switching elements are operated to read the voltages stored on said sampling capacitances on said at least one read node, said voltages read out within said row time.

16. The pixel of claim 11, wherein:
   said sampling capacitances comprise $C_{s\_hg}$ and $C_{r\_hg}$;
   said sampling capacitances $C_{s\_hg}$ and $C_{r\_hg}$ are connected to a shared HG node;
   said shared HG node is coupled to said output node through a HG sampling switch;
   one of said sampling capacitances $C_{s\_hg}$ and $C_{r\_hg}$ is connected to a third constant potential and the other of said sampling capacitances $C_{s\_hg}$ and $C_{r\_hg}$ is connected to a HG CDS node;
   said HG CDS node is coupled to a reference voltage through a HG clamp switch; and
   said HG CDS node is coupled to said read node through a HG select switch.

17. The pixel of claim 16, wherein:
said HG sampling switch and said HG clamp switch are closed and said HG select switch and said row select switch are open while said HG reset level is available at said output node;
said HG sampling switch is closed and said HG clamp switch, said HG select switch, and said row select switch are open while said HG signal level is available at said output node, thereby causing the voltage at said HG CDS node to be proportional to the difference between said HG signal level and said HG reset level; and
said HG sampling switch and said HG clamp switch are open and said HG select switch and said row select switch are closed during said pixel array readout.

18. The pixel of claim 16, wherein:
said sampling capacitances further comprise $C_{s\_lg}$ and $C_{r\_lg}$;
said sampling capacitances $C_{s\_lg}$ and $C_{r\_lg}$ are connected to a shared LG node;
said shared LG node is coupled to said output node through a LG sampling switch;
one of said sampling capacitances $C_{s\_lg}$ and $C_{r\_lg}$ is connected to a fourth constant potential and the other of said sampling capacitances $C_{s\_lg}$ and $C_{r\_lg}$ is connected to a LG UDS node;
said LG UDS node is coupled to a reference voltage through a LG clamp switch; and
said LG UDS node is coupled to said read node through a LG select switch.

19. The pixel of claim 18, wherein:
said LG sampling switch and said LG clamp switch are closed and said LG select switch and said row select switch are open while said LG reset level is available at said output node;
said LG sampling switch is closed and said LG clamp switch, said LG select switch, and said row select switch are open while said LG signal level is available at said output node, thereby causing the voltage at said LG UDS node to be proportional to the difference between said LG signal level and said LG reset level; and
said LG sampling switch, said LG clamp switch, and said HG select switch are open and said LG select switch and said row select switch are closed during said pixel array readout.

20. The pixel of claim 16, wherein:
said sampling capacitances further comprise $C_{s\_lg}$;
said sampling capacitance $C_{s\_lg}$ is connected between a LG sampling node and a fourth constant potential;
said LG sampling node is coupled to said output node through a LG clamp switch;
said LG sampling node is coupled to said read node through a LG select switch;
said LG clamp switch is closed and said LG select switch and said row select switch are open while said LG signal level is available at said output node; and
said LG clamp switch and said HG select switch are open and said LG select switch and said row select switch are closed during pixel array readout.

21. The pixel of claim 10, wherein said sampling capacitances are trench capacitors.

22. The pixel of claim 10, further comprising at least one aggregation switch that connects said read nodes of neighboring pixels in the horizontal and/or vertical direction, said aggregation switches optionally remaining on during said pixel array readout to effect pixel aggregation.

23. The pixel of claim 10, wherein said pixel is a vertically integrated circuit structure, consisting of said layer one, further comprising a second layer on which said processing circuitry resides, and a third layer on which said sampling capacitances reside.

24. The pixel of claim 1, wherein said capacitance $C_{fd}$ comprises the sum of the junction capacitances of transistors $M_{lg}$ and $M_{tg}$, the gate capacitance of transistor $M_{isf}$, and the parasitic capacitance at said first node.

25. The pixel of claim 1, wherein said capacitance $C_{int}$ comprises a metal-insulator-metal (MIM) capacitor.

26. The pixel of claim 25, arranged to form an image sensor, which is backside illuminated so that said MIM capacitor and any metal routing layers do not block incident illumination and thus do not reduce optical fill factor.

27. The pixel of claim 1, wherein said capacitance $C_{int}$ comprises a metal-oxide-metal (MOM) capacitor.

28. The pixel of claim 27, arranged to form an image sensor, which is backside illuminated so that said MOM capacitor and any metal routing layers do not block incident illumination and thus do not reduce optical fill factor.

29. The pixel of claim 1, further comprising circuitry which subtracts said HG reset level from said HG signal level to effect correlated double sampling (CDS).

30. The pixel of claim 29, wherein said circuitry resides in the pixel, in the column, or off-chip.

31. The pixel of claim 1, further comprising circuitry which subtracts said LG reset level from said LG signal level to effect correlated double sampling (CDS).

32. The pixel of claim 31, wherein said circuitry comprises full frame memory.

33. The pixel of claim 1, further comprising circuitry which subtracts said LG reset level from said LG signal level to effect uncorrelated double sampling (UDS), wherein, during each row readout, the LG reset level of the current frame is subtracted from the LG signal level of the previous frame.

34. The pixel of claim 33, wherein said circuitry resides in the pixel, in the column, or off-chip.

* * * * *